US007250937B2

(12) United States Patent
Takagi

(10) Patent No.: US 7,250,937 B2
(45) Date of Patent: Jul. 31, 2007

(54) HARD BASE KEY UNIT

(75) Inventor: Akira Takagi, Souwa-machi (JP)

(73) Assignee: Sunarrow Ltd, Tokyo (JP)

( * ) Notice: Subject to any disclaimer, the term of this patent is extended or adjusted under 35 U.S.C. 154(b) by 193 days.

(21) Appl. No.: 10/209,286

(22) Filed: Jul. 31, 2002

(65) Prior Publication Data

US 2003/0109229 A1 Jun. 12, 2003

(30) Foreign Application Priority Data

Dec. 12, 2001 (JP) ............................ 2001-378152

(51) Int. Cl.
*G09G 5/00* (2006.01)
*H03K 17/94* (2006.01)
*H03M 11/00* (2006.01)

(52) U.S. Cl. ......................... 345/168; 345/156; 341/22

(58) Field of Classification Search ........ 345/156–160, 345/168–172; 341/22–26; 200/314
See application file for complete search history.

(56) References Cited

U.S. PATENT DOCUMENTS 5,900,829 A * 5/1999 Gardner et al. ............... 341/26
6,498,614 B1 * 12/2002 Amari et al. ............... 345/168
6,576,856 B2 * 6/2003 Masaru et al. .............. 200/512
6,642,920 B2 * 11/2003 Osawa et al. ................. 341/22
6,677,545 B2 * 1/2004 Kenmochi .................. 200/314
6,876,837 B2 * 4/2005 Kuroshima et al. .......... 345/168
2001/0014152 A1 * 8/2001 Yang .......................... 379/422

* cited by examiner

*Primary Examiner*—David L. Lewis
(74) *Attorney, Agent, or Firm*—James V. Costigan; Hedman & Costigan P.C.

(57) ABSTRACT

A first object is to provide a key unit capable of preventing a problem that a key top gets under a key window frame of a casing of a movable telephone or the like during key pushing down, and capable of preventing floating of the key top and interferences with movements between keys in a narrow-pitch key board which cannot employ a key window frame. A second object is to provide a key unit of a novel thin structure, capable of eliminating a dual structure where an light guiding plate is superposed as a separate component. A hard base key unit comprises a hard base made of a hard resin plate and having a through hole on a plane thereof, a key pad made of a rubber-like elastic body film to cover the through hole 1 of the hard base, a switch thrusting projection formed integrally with the key pad on a plane of the key pad facing the inside of the through hole, and a key top made of a hard resin and provided at a position corresponding to the switch thrusting projection on the other plane of the key pad.

5 Claims, 5 Drawing Sheets

(A)

(B)

HARD BASE KEY UNIT

BACKGROUND OF THE INVENTION

1. Field of the Invention

The present invention relates to a key unit used for a mobile device such as a movable telephone and a personal digital assistance terminal (PDA), and more particularly to a key unit comprising a hard base made of a hard resin plate.

2. Description of the Related Art

A key unit is one of the components constituting a mobile device such as a movable telephone and a PDA, and includes a number of switch operation keys (pushbutton) collectively arranged on one sheet surface. Each key includes a key top made of hard resin, which is firmly fixed to a surface of a key pad made of flexible rubber, and a switch thrusting projection (so-called "thruster") provided on its backside. The keys are connected to each other through the key pad. By adhering a printed-circuit board having switch elements to an undersurface of the key unit thus constructed, a key switch is formed at a position corresponding to each key. The conventional art has employed a structure, where the key top on the key unit is viewed from a key window provided on a casing surface of a movable telephone or the like.

As a result of a recent progress in miniaturization of a movable telephone or the like, there has been a stronger demand for a thinner key unit, and a distance from a key top upper surface to the key unit undersurface has been excessively shortened. In such a thin key unit, an end of the key top gets under a key window frame of the casing when the key top is pushed down, consequently creating a problem of impossible returning of the pushed down key.

The foregoing problem may be attributed to the facts that the entire key unit is made of soft and elastic rubber, shape stability is lacking because of the excessively thin key unit, and the key top is slid in a cross direction because of deformation of the key unit during key pushing down. In addition, such a soft key unit has a difficulty of being subjected to automatic assembling.

As measures to deal with the getting-under of the key top, a key unit similar to that shown in FIG. 8(A) has heretofore been presented, which includes a ring-shaped projection (rib) provided around a center on the backside of the key top. In the case of an illuminated key, however, another problem occurs, that is, a shadow of the ring-shaped projection is seen from the key top upper surface, consequently spoiling the beauty.

In the conventional key unit, a structure similar to that shown in FIG. 8(B) has been employed, in which an light guiding plate for key top illumination is superposed on the key unit. However, this dual structure is contradictory to the demand for a thinner key unit.

On a keyboard of the rapidly developed PDA or the like, a need to arrange a number of keys on a narrow area has created a tendency to employ a so-called narrow pitch key unit, in which a space between the keys is extremely narrow. On such a keyboard, since there is no space for providing a key window frame similar to the above between adjacent key tops, positioning of the key tops must be carried out only by the soft key pad. In the key unit of such a structure, problems easily occur. For example, the key top catches on something to float, and pushing down of one key is transmitted to an adjacent key, causing interferences with movements of each other.

SUMMARY OF THE INVENTION

A first object of the present invention is to provide a key unit capable of improving its shape stability, preventing a key top from getting under a key window frame of a casing during key pushing down, preventing floating of the key top and interferences between keys on a narrow pitch keyboard which cannot employ a key window frame and can easily cope with an automatically assemble. A second object is to eliminate a dual structure, in which an light guiding plate as another component is superposed on a key unit.

The first object can be achieved by combining a hard base made of a hard resin plate with a flexible key pad made of a rubber-like elastic body, and imparting rigidity to the entire key unit while making the best use of flexibility of the key pad locally. In this case, if a translucent hard base is used, the second object can be simultaneously achieved because the hard base itself also serves as an light guiding plate.

There have been three modes for combinations of a key pad and a hard base. A first mode is that a required through hole (a key top is pushed down into this hole through the key pad) is provided on one flat hard base surface, and a key pad joined to a side wall of through hole of the hard base, and made of a rubber elastic body film to cover the through hole of the hard base. At this time, a switch thrusting projection is formed on one side of the key pad simultaneously and integrally with the key pad, and a key top is provided at a position corresponding to the switch thrusting projection on its backside. In the first mode, the rubber film of the key pad is separated for each hole. The invention defined in claim 1 embodies solving means described herein.

Second and third modes of the combinations of the key pad and the hard base are similar to the first mode in that a key pad joined to a side wall of through hole of the hard base, and made of a rubber elastic body film to cover the through hole of the hard base, and a key top and a switch thrusting projection are respectively provided on upper and lower surfaces of the key pad. However, the second mode is different from the first mode in that a rubber-like elastic body film connected to the key pad in the through hole is formed on an upper surface of a portion other than the through hole of the bard base (surface of the hard base directed in the same direction as that of the key pad, in which the key top is present. Its backside is called an "undersurface"). The third mode is different from the first mode in that rubber-like elastic films connected to the key pad are formed on both upper and lower surfaces of a portion other than the through hole of the hard base. In other words, in the second and third modes, the rubber-like elastic body film of the key pad is continuous over each hole, and joined to the hard base on other than the hole. The inventions defined in claims 2 and 3 embody solving means described herein. The first to third modes may be applied side by side on each different portion of the hard base.

The second object can be achieved by imparting translucency to the hard base, the key pad and the key top in the foregoing mode of the key pad and the hard base. In this case, in order to arrange a light emitting device as a light source on the center of thickness of the hard base, a hole for inserting the light emitting device may be provided on a portion other than the through hole of the hard base. The invention defined in claim 4 embodies solving means described herein.

PREFERRED EMBODIMENTS OF THE INVENTION

Figure 1:
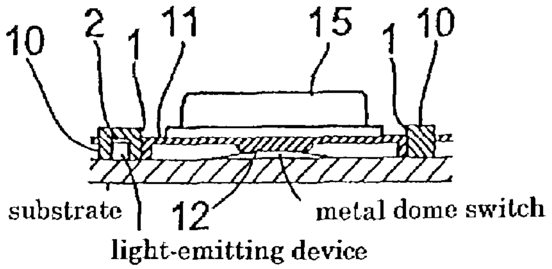
FIG. 1 is a side sectional view showing a key structure corresponding to a first mode in a combination of a hard base and a key pad.
Figure 2:
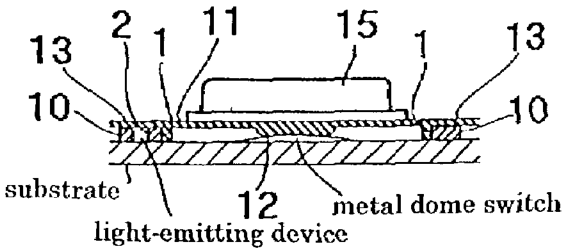
FIG. 2 is a side sectional view showing a key structure corresponding to a second mode in the combination of the hard base and the key pad.
Figure 3:
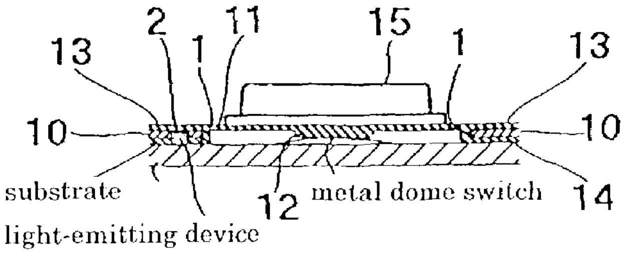
FIG. 3 is a side sectional view showing a key structure corresponding to a third mode of the hard base and the key pad.

Next, description will be made of the modes of the present invention with reference to the accompanying drawings. FIGS. 1 to 3 correspond to the foregoing first to third modes in the combinations of the key pad and the hard base. In FIGS. 1 to 3, reference numeral 1 denotes a through hole; 2, a hole for inserting a light emitting device; 10, a hard base; 11, a key pad; 12, a switch thrusting projection; 13, a rubber film formed on an upper surface (key top side) of the hard base; 14, a rubber film formed on an undersurface (switch thrusting projection side) of the hard base and 15, a key top. In FIGS. 1 to 3, a printed-circuit board including switch elements and a light emitting device are shown to assist understanding, but these components are outside a scope of the present invention.

Now, description is made of a first mode of a hard base key unit according to the present invention by referring to FIG. 1. That is, the hard base key unit includes a hard base 10 made of a hard resin plate and having a through hole 1 on a plane thereof, a key pad 11 joined to a side wall of the through hole of the hard base, and made of a rubber elastic body film to cover the through hole of the hard base, a switch thrusting projection 12 formed integrally with the key pad 11 on a surface of the key pad 11 facing the inside of the through hole 1, and a key top 15 made of a hard resin plate and provided at a position corresponding to the switch thrusting projection 12 on the other surface of the key pad 11.

In the key unit of the present mode, the key pad 11 is present only in the through hole 1 of the hard base 10 (end surface of the key pad 11 is joined to a side wall of the through hole 1), and not superposed on a surface of the hard base 10. Accordingly, if a thickness from a key top upper surface to a key unit lower surface is constant, a thickest (highest rigidity) hard base 10 can be employed compared with other modes.

A second mode of the present invention is described by referring to FIG. 2. That is, a hard base key unit includes a hard base 10 made of a hard resin plate and having a through hole 1 on a plane thereof, a key pad 11 made of a rubber-like elastic body film to cover the through hole 1 of the hard base 10, a rubber-like elastic body film 13 are molded integrally to the key pad 11 on a surface of a portion other than the through hole 1 of the hard base 10, a switch thrusting projection 12 formed integrally with the key pad 11 on a surface of the key pad 11 facing the inside of the through hole 1, and a key top 15 made of a hard resin plate and provided at a position corresponding to the switch thrusting projection 12 on the other surface of the key pad 11.

In the key unit of this mode, since the key pad 11 is joined to the hard base 10 on a surface of the hard base 10 in addition to a side wall of the through hole 1, a joining area between the two can be set larger compared with that of the first mode.

Descriptions will be made of a third mode of the present invention with reference to FIG. 3. That is, a hard base key unit includes a hard base 10 made of a hard resin plate and having a through hole 1 on a plane thereof, a key pad 11 made of a rubber-like elastic body film to cover the through hole 1 of the hard base 10, a rubber-like elastic body film 13 are molded integrally to the key pad 11 on an upper surface of a portion other than the through hole 1 of the hard base 10, a rubber-like elastic body film 14 are molded integrally to the key pad 11 on an undersurface of a portion other than the through hole 1 of the hard base 10, a switch thrusting projection 12 formed integrally with the key pad 11 on a surface of the key pad 11 facing the inside of the through hole 1, and a key top 15 made of hard resin and provided at a position corresponding to the switch thrusting projection 12 on the other surface of the key pad 11.

In the key unit of the this mode, the key pad 11 is joined to the hard base 10 on both upper and lower surfaces of the hard base 10 in addition to a side wall of the through hole 1, a joining area between the two can be set largest compared with the first and second modes, thereby achieving a most robust joining state.

Next, descriptions will be made for a fourth mode of the present invention. This mode relates to a way of achieving the foregoing second object. Reference is made to FIGS. 1 to 3. That is, in a hard base key unit, a hard base 10, a key pad 11 and a key top 15 have translucency, and a hole 2 for inserting a light emitting device is formed on a portion other than the through hole 1 of the hard base 10.

The translucent hard base used in this mode also serves as an light guiding plate. Accordingly, it is not necessary to superpose an light guiding plate as another body on the key unit, and thus the entire device can be made thin.

A fifth mode of the present invention relates to a method for manufacturing the hard base key unit of the fourth mode. That is, the hard base key unit manufacturing method includes a step of forming a key top 15 by using translucent hard resin, a step of making a plate-like hard base 10 made of translucent hard resin, the hard base 10 having a through hole 1 and a hole 2 for inserting a light emitting device on a plane thereof, a step of arranging the hard base 10 in a molding die, a step of poring a translucent rubber elastic body material in the molding die, and forming a key pad 11 made of a film of the rubber elastic body integrally with the hard base 10, a step of forming a switch thrusting projection 12 integrally with the key pad 11 on a surface of the key pad 11 facing the inside of the though through hole 1, and a step of providing the key top 15 in a position corresponding to the switch thrusting projection 12 on a surface opposite the switch thrusting projection 12 so as to sandwich the key pad 11 therebetween.

In the above manufacturing method, to form the key pad 11 integrally with the hard base 10, a so-called insertion molding method is employed, in which a hard base 10 as a separate body is formed beforehand, the hard base 10 is arranged in a molding die, and poring a translucent rubber-like elastic body material is poured into the molding die. In this case, preferably, a proper pretreatment is carried out for activating a surface of the hard base 10 beforehand in order to firmly join together the hard base 10 made of hard resin and the key pad 11 made of a rubber-like elastic body.

Embodiments

First Embodiment

Figure 4:
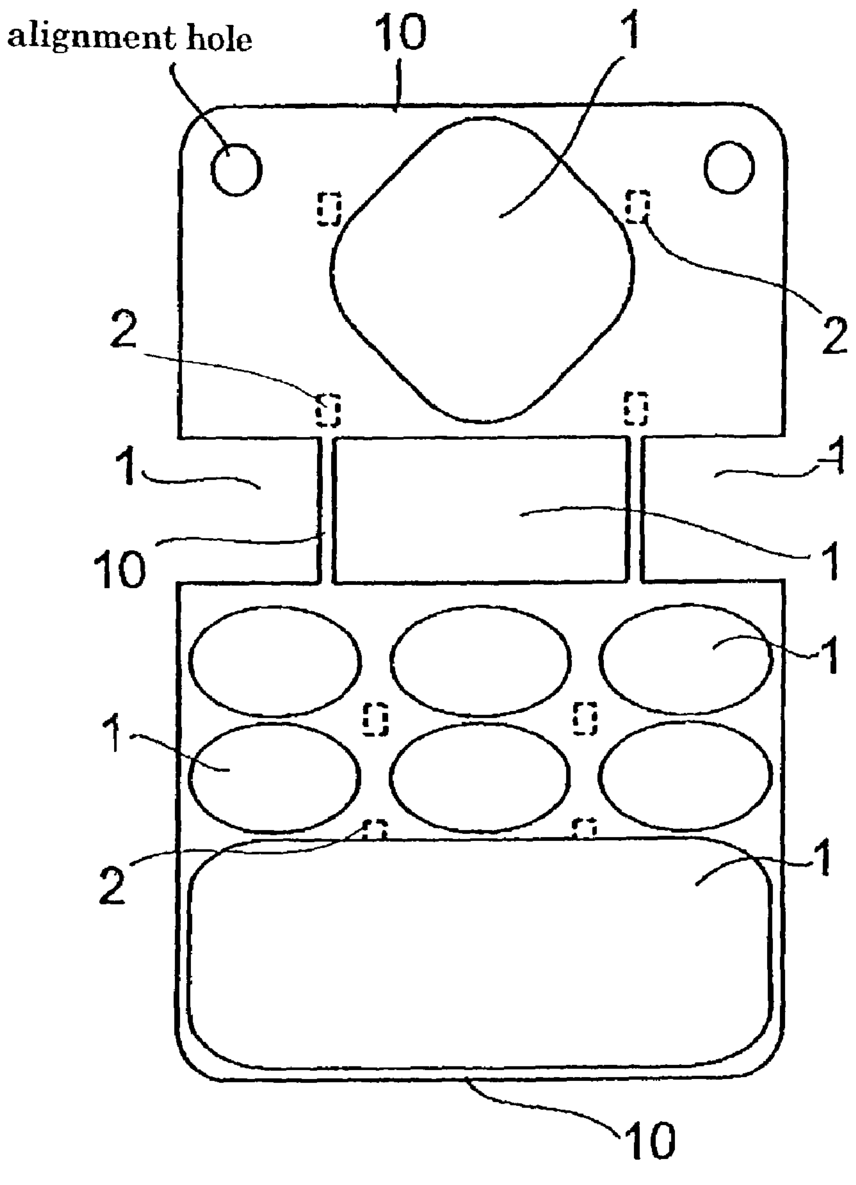
FIG. 4 is a plan view showing a hard base in a hard base key unit according to a first embodiment of the present invention.

Next, descriptions will be made of the preferred embodiments of the present invention with reference to FIGS. 4 to 6(C). FIG. 4 is a plan view showing a hard base 10 in a hard base unit according to this embodiment. The hard base 10 shown in FIG. 4 includes through holes 1 of various shapes, holes 2 for inserting light emitting devices, and two positioning holes provided on an upper side.

The through holes 1 shown in FIG. 4 have five different shapes. The uppermost through hole corresponds to one multi-direction operative key. Short square through holes in both sides of a second stage have three sides, and each corresponds to one key. An oblong through hole in a center of the second stage corresponds to two keys. At a third stage, six elliptical through holes each corresponding to one key are arrayed. A large through hole at the lowest stage includes six keys.

Figure 5:
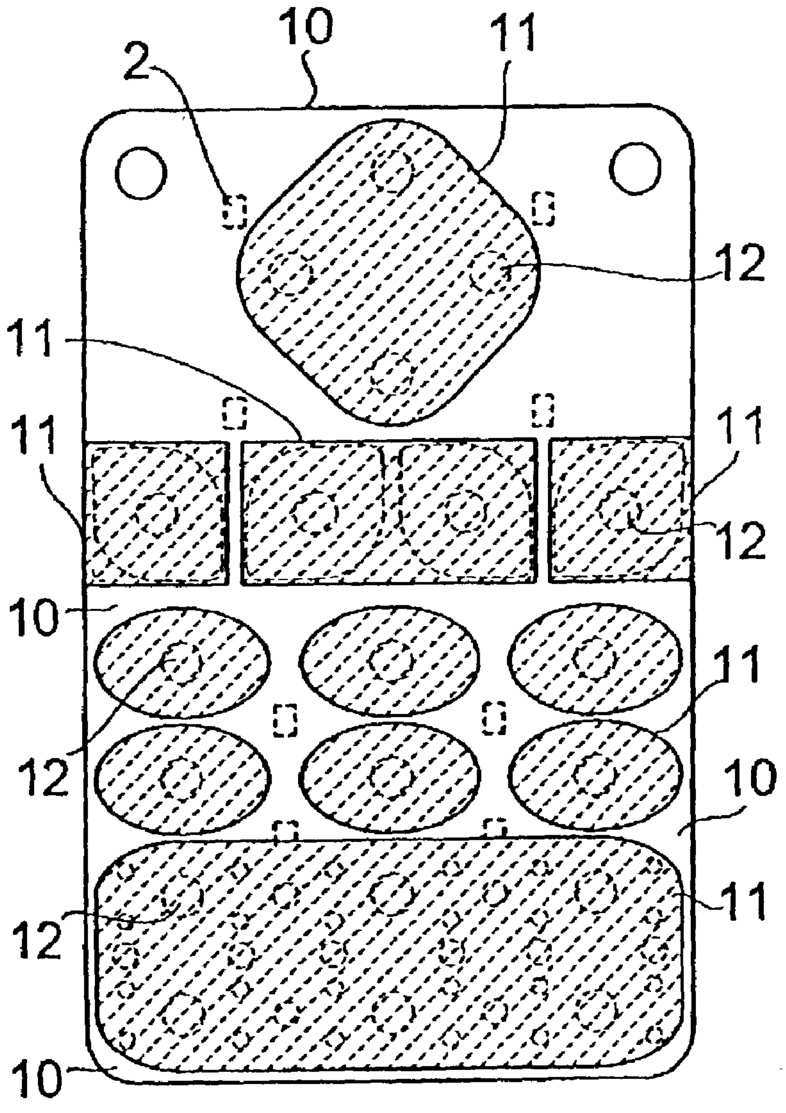
FIG. 5 is a plan view showing a state where a key pad is formed to close each through hole of the hard base shown in FIG. 4.
Figure 6:
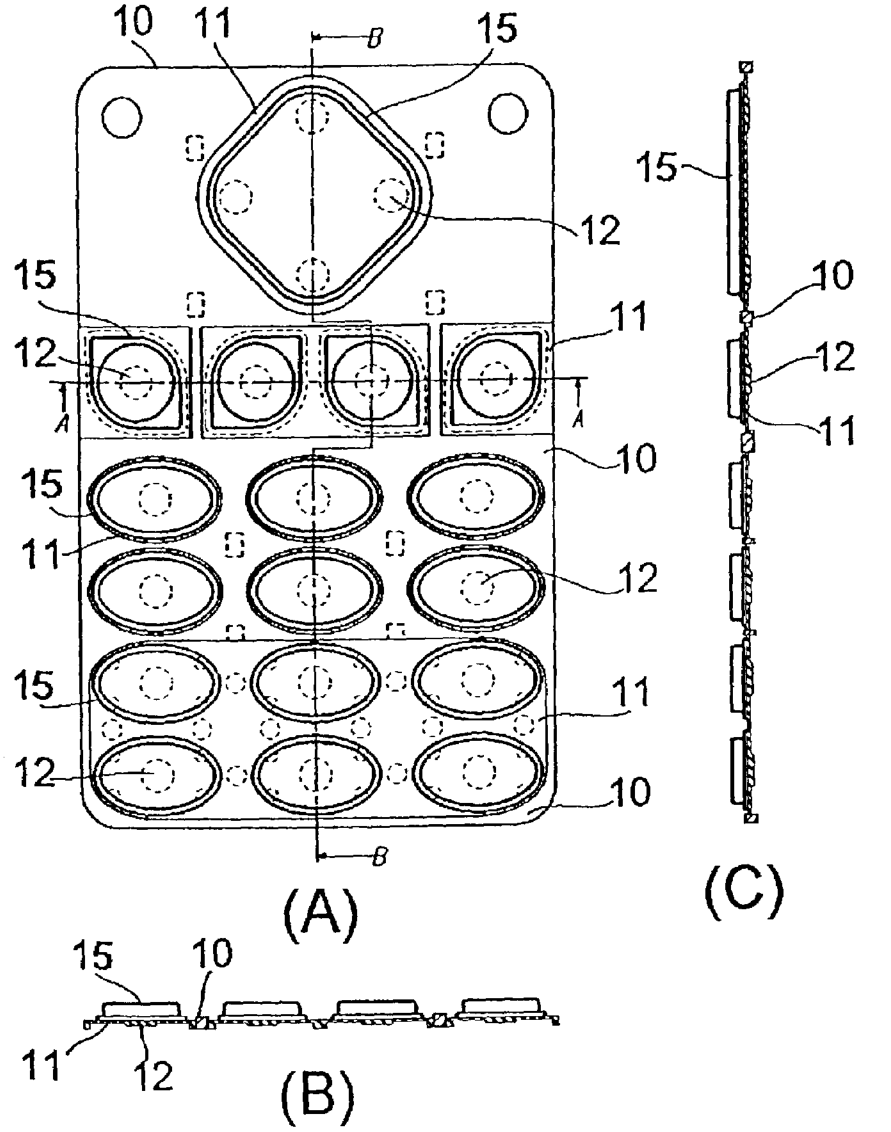
FIG. 6(A) is a plan view showing a state where a key top is placed on a surface of the key pad shown in FIG. 5.
FIG. 6(B) is a sectional view taken on cutting line A-A of FIG. 6(A).
FIG. 6(C) is a sectional view taken on cutting line B-B of FIG. 6(A).

FIG. 5 is a plan view showing a state where a key pad 11 is formed to close each through hole 1. In the drawing, a hatched portion by dotted lines indicates a key pad 11. A small circle on a plane of the key pad 11 represents a switch thrusting projection 12 formed on a backside of the key pad 11.

FIG. 6(A) is a plan view showing a state where a key top 15 is placed on a surface of the key pad 11 shown in FIG. 5, and a key unit is completed. FIG. 6(B) is a sectional view taken on cutting line A-A of FIG. 6(A). FIG. 6(C) is a sectional view taken on cutting line B-B of FIG. 6(A). A side sectional view where a key pad 11, a switch thrusting projection 12 and a key top 15 are assembled in each through hole 1 is shown in FIG. 1.

In the hard base key unit according to the embodiment thus constructed, the key pad 11 is formed for each through hole in such a way as to close the through hole 1 on the plane of the hard base 10 made of one hard resin plate, and the key tops 15 and the switch thrusting projections 12 are respectively placed by required set numbers on the surface and backside of the hard base 10. Thus, the key pads are dispersedly arranged for every through holes 1 different from the conventional case where the entire key pad is arranged as one continuous sheet.

Therefore, a frame made of hard resin which surrounds one to several key groups is formed, and a marginal portion of the key pad where no keys exist is replaced by the surface of the hard base 10. As a result, shape stability of the entire key unit is improved, and a movement of the key top in a cross direction is regulated. Thus, it is possible to prevent a problem where the key top gets under the key window frame during key pushing down.

Also, as shown in FIG. 3, a light emitting device can be arranged on the center of thickness of the translucent hard base 10. Since light emitted from the light emitting device is transmitted through the hard base 10 and further transmitted through the through hole 1 into the key pad 11 made of the translucent rubber, the light from the light emitting device is surely guided to the backside of the key top 15. Since the hard base 10 apparently serves as the light guiding plate, it is not necessary to superpose an light guiding plate as a separate component, thereby achieving thinning of the device.

Second Embodiment

Figure 7:
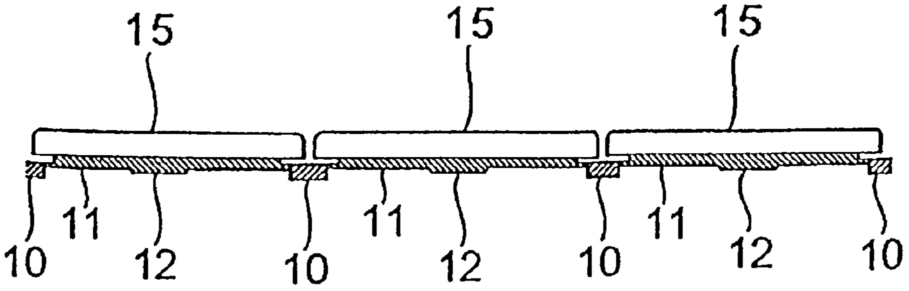
FIG. 7 is a side sectional view showing a narrow pitch key unit comprising a hard base according to a second embodiment of the present invention.
Figure 8:
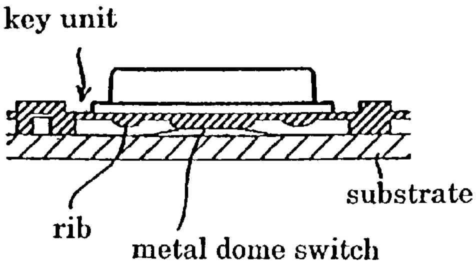
FIG. 8(A) is a side sectional view showing a conventional key unit comprising a getting-under preventing rib.
FIG. 8(B) is a side sectional view showing a conventional key unit including an light guiding plate and a light emitting device.
Figure 8:
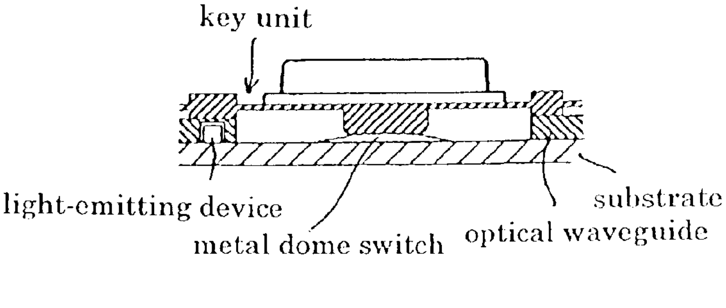

Next, descriptions will be made for a narrow pitch key unit including a hard base 10 according to a second embodiment of the present invention. FIG. 7 is a side sectional view showing the narrow pitch key unit according to the second embodiment. In the drawing, reference numerals similar to those of the first embodiment are used.

In the key unit of the first embodiment, a diameter of the through hole 1 on the hard base 10 is set slightly larger than that of the key top 15. Conversely, the one in the present embodiment is set smaller, and an arrangement is made such that a boundary portion (bridge portion) between through holes can correspond to a narrow space between adjacent key tops 15.

In the key unit thus constructed, even in a state where a key window frame cannot be employed, a movement of each key is regulated by the through hole 1 on the hard base 10. Thus, floating of the key top is prevented, and the movement of each key is insulated from another by rigidity of the hard base 10, making it possible to prevent mutual interferences between the keys.

According to the key unit of the inventions defined in claims 1 to 3, since the rigidity of the entire key unit is improved, and the movement of the key top in the cross direction is regulated, it is possible to effectively prevent the problem that the key top gets under the key window frame of the casing during key pushing down. Moreover, since the movement of each key is insulated from another in the narrow-pitch key board which cannot employ a key window frame, it is possible to effectively prevent the floating of the key top and inter-key interferences. Since rigidity suited to handling by a robot hand is provided, automatic assembling is facilitated.

According to the key unit of the invention defined in claim 4, since the hard base serves as the conventional light guiding plate, and it is not necessary to superpose an light guiding plate as a separate component on the key unit, the device can be made thin.

Furthermore, according to the invention defined in claim 5, the method for efficiently manufacturing the hard base key unit of the invention defined in claim 4 is provided.

What is claimed is:

1. A narrow pitch hard base key unit comprising:

a hard base made of a transparent hard resin plate, and having a through hole on a plane thereof;

a key pad joined to a side wall of the through hole of the hard base and made of a transparent rubber elastic body film to cover the through hole of the hard base;

a switch thrusting projection formed integrally with the key pad on a surface of the key pad facing an inside of the through hole;

a key top made of a transparent hard resin in a position corresponding to the switch thrusting projection on the other surface of the key pad; and a hard base in which a diameter of through hole on the hard base is set smaller than that of the key top, and an arrangement is made such that a boundary portion between said through hole can corresponds to a narrow space between adjacent key tops.

2. A narrow pitch hard base key unit comprising:

a hard base made of a hard resin plate, and having a through hole on a plane thereof;

a key pad joined to a side wall of the through hole of the hard base and made of a rubber elastic body film to cover the through hole of the hard base a key pad joined to a side wall of the through hole of the hard base and made of a rubber elastic body film to cover the through hole of the hard base;

a rubber elastic body film is molded integrally to the key pad on an upper surface of a portion other than the through hole of the hard base;

a switch thrusting projection formed integrally with the key pad on a surface of the key pad facing the inside of the through hole; and a key top made of a hard resin and provided in a position corresponding to the switch thrusting projection on the other surface of the key pad.

3. A narrow pitch hard base key unit according to claim 1, comprising;

a rubber elastic body film molded integrally to the key pad of an upper surface of a portion other than the through hole of the hard base; and a rubber elastic body film molded integrally to the key pad on an undersurface of a portion other than the through hole of the hard base.

4. A method for manufacturing the narrow pitch hard base key unit of claim 1, comprising the steps of:

forming a key top by using a translucent hard resin;

making a platelike hard base of a translucent hard resin, the hard base having a through hole and a hole for inserting a light emitting device;

arranging the hard base in a molding die;

pouring a translucent rubber elastic-body material in the molding die, forming a key pad made of a film of the rubber elastic body joined, to a side wall of the through hole of the hard base, and made of a rubber elastic body film to cover the through hole of the hard base, and a switch thrusting projection integrally with the key pad on a surface of the key pad facing the inside of the through hole; and providing the key top in a position corresponding to the switch thrusting projection on a surface opposite the switch thrusting projection sandwiching the key pad.

5. A narrow pitch hard base key unit comprising:

a hard base made of a transparent hard resin plate which imparts rigidity to said key unit, said hard base also having a through hole on a plane thereof;

a key pad joined to a side wall of the through hole of the hard base and made of a transparent rubber elastic body film to cover the through hole of the hard base;

a switch thrusting projection formed integrally with the key pad on a surface of the key pad facing an inside of the through hole;

a key top made of a transparent bard resin in a position corresponding tothe switch thrusting projection on the other surface of the key pad; and a hard base in which a diameter of through hole on the bard base is set smaller than that of the key top, and Sri arrangement is made such that a boundary portion between said through hole can corresponds to a narrow space between adjacent key tops.

* * * * *